United States Patent
Lunelli et al.

(10) Patent No.: US 7,328,397 B2
(45) Date of Patent: Feb. 5, 2008

(54) METHOD FOR PERFORMING ERROR CORRECTIONS OF DIGITAL INFORMATION CODIFIED AS A SYMBOL SEQUENCE

(75) Inventors: Massimiliano Lunelli, Cologno Monzese (IT); Rino Micheloni, Turate (IT); Roberto Ravasio, Ponte S. Pietro (IT); Alessia Marelli, Dalmine (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 570 days.

(21) Appl. No.: 10/805,168

(22) Filed: Mar. 19, 2004

(65) Prior Publication Data
US 2005/0050434 A1  Mar. 3, 2005

(30) Foreign Application Priority Data
Mar. 19, 2003 (EP) .................. 03425172

(51) Int. Cl.
*H03M 13/00* (2006.01)
(52) U.S. Cl. .......... 714/785; 714/758; 714/801
(58) Field of Classification Search ........ 714/785, 714/758, 801
See application file for complete search history.

(56) References Cited

U.S. PATENT DOCUMENTS

| | | | |
|---|---|---|---|
| 3,665,396 A * | 5/1972 | Forney, Jr. .................. | 714/789 |
| 4,566,105 A * | 1/1986 | Oisel et al. .................. | 714/756 |
| 4,841,300 A * | 6/1989 | Yoshida et al. .............. | 341/94 |
| 5,040,179 A * | 8/1991 | Chen .......................... | 714/759 |
| 5,297,153 A * | 3/1994 | Baggen et al. .............. | 714/782 |
| 5,343,426 A * | 8/1994 | Cassidy et al. ........ | 365/189.02 |
| 5,343,481 A * | 8/1994 | Kraft .......................... | 714/782 |
| 5,389,835 A * | 2/1995 | Yetter ......................... | 326/98 |
| 5,459,742 A * | 10/1995 | Cassidy et al. ............. | 714/769 |
| 5,754,753 A * | 5/1998 | Smelser ........................ | 714/8 |
| 5,884,304 A * | 3/1999 | Davis et al. .................. | 707/4 |
| 6,092,233 A * | 7/2000 | Yang .......................... | 714/784 |
| 6,516,407 B1 * | 2/2003 | Suga et al. ................. | 712/226 |

OTHER PUBLICATIONS

European Search Report, EP 03425172, Sep. 17, 2003.
XP-002252304, R.E. Blahut, Theory and Practise of Error Control Codes, 1983.
XP-002252305, Elwyn R. Berlekamp, Algebraic Coding Theory, 1984.

* cited by examiner

*Primary Examiner*—Jacques Louis-Jacques
*Assistant Examiner*—Mujtaba K. Chaudry
(74) *Attorney, Agent, or Firm*—Graybeal Jackson Haley LLP

(57) ABSTRACT

A method and system for making error corrections on digital information coded as symbol sequences, for example digital information stored in electronic memory systems or transmitted from and to these systems is described, provides the transmission of sequences incorporating a portion of error corrector code allowing the sequence which is more probably the original transmitted through the calculation of an error syndrome using a parity matrix to be restored when received.

Advantageously according to embodiments of the invention, the error code incorporated in the original sequence belongs to a non Boolean group.

6 Claims, 2 Drawing Sheets

METHOD FOR PERFORMING ERROR CORRECTIONS OF DIGITAL INFORMATION CODIFIED AS A SYMBOL SEQUENCE

PRIORITY CLAIM

This application claims priority from European patent application No. 03425172.8, filed Mar. 19, 2003, which is incorporated herein by reference.

TECHNICAL FIELD

In its more general aspect, embodiments of the present invention relate to methods and systems for applying the self-corrector code theory to digital information coded as symbol sequences, for example in the Boolean logic, stored in electronic memory systems or transmitted from and to these systems.

More particularly, an embodiment of the invention relates to a method as above providing the transmission of sequences incorporating a portion of error corrector code allowing the sequence, which is more probably the original transmitted through the calculation of an error syndrome by using a parity matrix, to be restored when received.

BACKGROUND

In the specific technical field of communication systems, such as communication system 100 shown in FIG. 1, it is well known that any message C comprising digital information can be processed and transferred from a system to another through electronic communication means which might be affected by noise.

In substance, a sequence $\underline{x}$ of Boolean symbols transmitted by a transmitter 102 through a communication channel 104 undergoing noise can be received at a receiver 106 as a different sequence $\underline{y}$ from which it is necessary to go back to the initial sequence $\underline{x}$.

Traditionally, the sequence $\underline{x}$ of symbols to be transmitted comprises an additional or redundant portion including an error corrector code allowing the message, which is more probably the original even with errors, to be restored when received.

These error corrector codes are based on well known mathematical theories, such as for example the Hamming code theory, which are presently applied in several contexts wherein it is necessary to remedy noise in communication channels.

For a better understanding of all aspects of the present invention, a detailed description of the most used methods for correcting errors in digital information coded as symbol sequences in the Boolean logic is illustrated hereinafter.

0.1 Basic Definitions

Definition 1 Given m·n real numbers, a table like the following one is called matrix of the type [m×n]:

$$M = \begin{pmatrix} a_{11} & a_{12} & \cdots & a_{1n} \\ a_{21} & a_{22} & \cdots & a_{2n} \\ \vdots & & & \vdots \\ a_{m1} & a_{m2} & \cdots & a_{mn} \end{pmatrix}$$

Definition 2 The transpose of the above matrix, indicated with $M^T$, is the matrix:

$$\begin{pmatrix} a_{11} & a_{21} & \cdots & a_{m1} \\ a_{12} & a_{22} & \cdots & a_{m2} \\ \vdots & & & \vdots \\ a_{1n} & a_{2n} & \cdots & a_{mn} \end{pmatrix}$$

obtained from M by exchanging, in order, rows with columns.

Definition 3 A n-×-n-order square matrix M is considered. Fixing an element $a_{ik}$ of the matrix M and eliminating therein the row and the column crossing in the element (the i-th row and the k-th column) a square matrix of order (n−1)×(n−1) is obtained, whose determinant is called complementary minor of $a_{ik}$ and will be indicated with $M_{ik}$.

Definition 4 The determinant of the second order matrix is the number:

$$a_{11}a_{22} - a_{12}a_{21}$$

Definition 5 The determinant of a n-order matrix is:

$$\sum_{k=1}^{n} a_{ik} \cdot (-1)^{i-k} M_{ik}$$

Definition 6 The square matrix having 1 as elements aii and 0 elsewhere is called identity matrix and is indicated with I.

Definition 7 A group G is a set in which an operation * is defined, for which G is closed for *, i.e. if g ∈ G and h ∈ G⇒g*h ∈ G;
* is associative;
G has the identity, i.e. ∃ and ∈ G so that e*g=g*e=g∀g∈ G;
∀g ∈ G the inverse exists, i.e. ∃g$^{-1}$ ∈ G so that g-$^{1}$*g=g* g-$^{1}$=e.

Definition 8 If the operation * is the sum the group is called additive

Definition 9 A group is called abelian if the operation * is commutative

Definition 10 The set {0,1,2, . . . , p−1} is called remainder class (mod p) and is indicated with $Z_p$, the property being that in these classes p=identity.

Definition 11 A Boolean group is a binary group, i.e. a group containing only the numbers 0 and 1 and 1+1=0.

Definition 12 A set of vectors $v_1, \ldots, v_k$ is linearly dependent if and only if there are some scalars $c1, \ldots, c_k \neq 0$ so that $c_1v_1 + c_2v_2 + \ldots + c_kv_k = 0$.

Definition 13 A family of vectors is called base of the area if it is a generating family, i.e. any other vector of the area is a linear combination of these vectors, and it is composed of linearly independent vectors.

0.1.1 Codes

The aim of the self-corrector code theory, a branch of the information theory, was originally born to solve some practical problems in the communication of coded digital information. A message is considered as a block of symbols of a finite alphabet; it is usually a sequence of 0 and 1 but it can be also any number, a letter or a complete sentence. The message is transmitted through a communication channel undergoing a noise. The aim of the self-corrector code theory is to add redundant terms to the message so that it is possible to go back to the original message if the transmitted message has been damaged. First of all, a difference must be made between diagnosing and correcting errors. Diagnostics detects the presence of an error, while the correction detects and corrects the error.

Each message called c consists of k information digits. The coding turns, according to certain rules, each input message c into a binary nth number x with n>k.

This binary nth number x is the code word of the message c. During the transmission some errors can occur, the binary nth number y being thus received $$c \rightarrow x \rightarrow channel \rightarrow y$$

The area V of all nth numbers of 0 and 1 will be now considered adding component vectors per module component 2.

Definition 14 A linear binary code [n,k] is the set of all linear combinations of k($\neq$0) independent vectors in V. Linear means that if two or more vectors are in the code, also their sum is therein.

Definition 15 A generating matrix G for a linear code is a matrix k×n whose rows are a base for C.

Definition 16 A parity matrix H of a linear code is a matrix n×k so that G·H=0.

Definition 17 H is the parity matrix of a code C w·$\in$ C if and only if $wH^T$=0.

Definition 18 G is called in standard form if G=($I_k$P) where $I_k$ is the identity matrix k×k and P is a matrix k×(n-k). If G is in the systematic or standard form, then the first k symbols of a word are called information symbols.

Theorem 19 If a code C [n,k] has a matrix G=($I_k$P) in the standard form, then a C parity matrix is H=($-P^T I_{n-k}$) where $p^T$ is the transpose of P and is a matrix (n-k)×k and $I_{n-k}$ is the identity matrix (n-k)×(n-k)

Systematic codes have the advantage that the data message is in the code word and it can be read before decoding. For codes in the non-systematic form the message is no more recognizable in the coded sequence and an inverter is needed to recognize the data sequence.

Definition 20 Being C a linear code with parity matrix H, then, given $\underline{x}$ a binary nth number $\underline{x}H^T$, is called syndrome of $\underline{x}$.

Definition 21 The weight of a vector u is the number of component being different from 0.

Definition 22 The code minimum weight d is the weight of the vector different from $\underline{0}$ having the lowest weight in the code.

d is thus a measure of the "quality" of a code.

Defined a sphere Sr(u) with radius r around a vector u like $S_r(u)=\{v \in V | d(u,v) \geq r\}$ Theorem 23 If d is the minimum weight of a code C, then C can correct at most $$t = \left[\frac{d-1}{2}\right]$$

errors and vice versa.

Corollary 24 C has a minimum weight d if d is the highest number so that each d-1 columns of the parity matrix H are independent.

Supposing for example that a code in the systematic form correcting 2 errors is to be produced. The matrix H will be composed of the identity matrix and of a matrix $P^T$ having 4 linearly independent columns, i.e. so that the determinant of the sub-matrix composed of these four columns $\neq$0. Therefore, according to the number of errors to be corrected, a matrix H with d-1 linearly independent columns is searched. Therefore, given n and k, a code with d being the widest possible is searched in order to correct more errors.

It is however possible to have vectors in V which are not comprised in any of these spheres.

Definition 25 A minimum-weight-d code C is called perfect if all vectors in V are comprised in $$\text{spheres of radius } t = \left[\frac{d-1}{2}\right]$$

around the code words. In this case it can be said that the spheres cover the area.

For the given n and k they are the best codes.

Theorem 26 For a perfect binary code [n,k] to exist, n, k and t must satisfy the following equation $$\left(\binom{n}{0}+\binom{n}{1}+\cdots+\binom{n}{t}\right)2^k = 2^n$$

Generally,

Theorem 27 For a code [n,k] to exist, n, k and t must satisfy the following inequality known as Hamming inequality:

$$\left(\binom{n}{0}+\binom{n}{1}+\cdots+\binom{n}{t}\right)2^k \geq 2^n$$

When the word y is received the word x being sent and afterwards the data message c are to be searched. With the following formula: $y=x+\xi_t \Rightarrow H(m+\xi_t)=H\xi_t$ where $\xi t$ is a particular error class. If $H\xi_t \in H$, then it can be said which is the wrong position.

Supposing that an error occurs:

$$m+\xi_i \Rightarrow H(m+\xi_i)=H\xi_i$$

$$H\xi_i \in H? \rightarrow \text{wrong position: } i$$

Supposing now that two errors occur:

$$m+\xi_i+\xi_j \Rightarrow H(m+\xi_i+\xi_j)=H\xi_i+H\xi_j=s$$

$$\forall \xi_i \rightarrow H\xi_i+H\xi_j \in H? \rightarrow \text{wrong positions: } i \text{ and } j$$

The following practical example for corrector codes of one error (Hamming codes) is now examined: the Hamming code [7,4] described by the following generating matrix is considered:

$$G = \begin{pmatrix} 1 & 0 & 0 & 0 & 0 & 1 & 1 \\ 0 & 1 & 0 & 0 & 1 & 0 & 1 \\ 0 & 0 & 1 & 0 & 1 & 1 & 0 \\ 0 & 0 & 0 & 1 & 1 & 1 & 1 \end{pmatrix}$$

The first 4 positions are considered as the information positions and the last 3 positions as redundancy positions. Therefore the first row is the message 1 0 0 0 and so on. All words are obtained by adding (mod 2) those rows. For example the message u=(1011) is coded as $\underline{x}$=

$$H = \begin{pmatrix} 0 & 0 & 0 & 1 & 1 & 1 & 1 \\ 0 & 1 & 1 & 0 & 0 & 1 & 1 \\ 1 & 0 & 1 & 0 & 1 & 0 & 1 \end{pmatrix}$$

(1011010). The parity matrix H is considered:

It must be noted that the matrix columns have been written so that the i-th column is composed of 2-based i-development coefficients, in case completed by 0.

Supposing to send the message $\underline{x}$ above and that an error occurs. The message $\underline{y}=(1010010)$ is thus received. The syndrome is calculated:

$$H\underline{x}^T=(100)$$

(1 0 0) is the binary representation of 4; the wrong bit is therefore the fourth.

The ideal is thus to search perfect codes, but they are not always found, moreover codes recognizing an error of the 0→1 type from 1→0 are wished.

Although advantageous under many aspects, the methods presently used require adding a redundancy information portion which, the size of the single message to be coded being fixed, cannot be lower than a minimum indicated. A technical problem underlying embodiments of the present invention is to provide a linear code protecting digital information coded like binary symbol sequences and overcoming the limits of the solutions presently provided by the prior art.

SUMMARY

According to one aspect of the invention, a coding is identified for a binary alphabet in non Boolean groups, i.e. in non binary groups.

DETAILED DESCRIPTION

Figure 1:
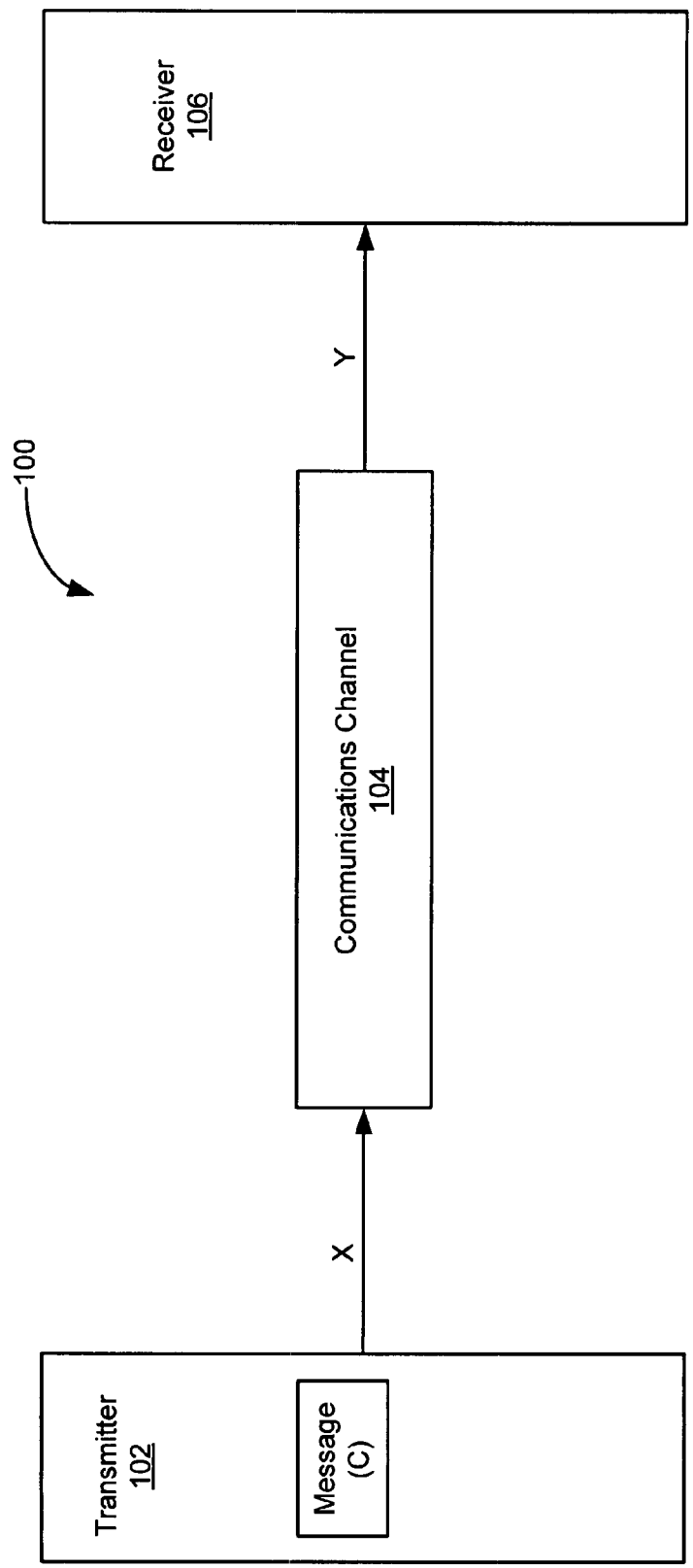
FIG. 1 is a block diagram of a conventional communication system including error detection and correction.
Figure 2:
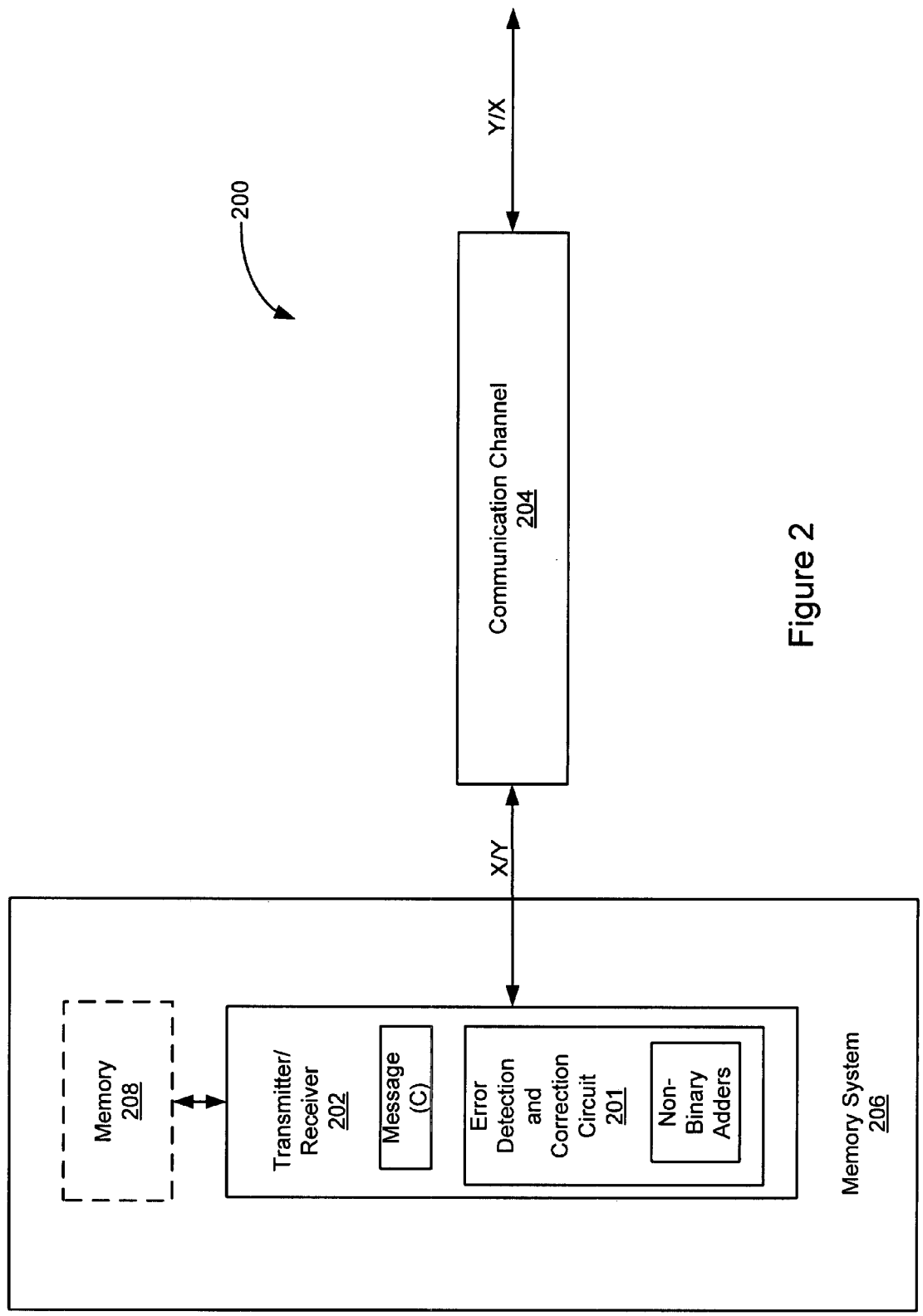
FIG. 2 is a block diagram of a communication system including error detection and correction circuitry according to one embodiment of the present invention.

FIG. 2 is a block diagram of a communication system 200 including error detection and correction circuitry 201 for executing a method according to an embodiment of the invention. This method applies self-corrector code theory to digital information coded as symbol sequences. The system 200 further includes a transmitter/receiver 202 that operate in conjunction with the circuitry 201 to transmit messages X and receive messages Y over and a communications channel 204.

More particularly, a method according to one embodiment of the invention allows error corrections to be performed on digital information coded as symbol sequences $\underline{x}$, for example digital information stored in electronic memory systems or transmitted from and to these systems and providing the transmission of sequences $\underline{x}$ incorporating an error corrector code portion allowing the sequence $\underline{x}$, which is more probably the original transmitted through the calculation of an error syndrome using a parity matrix, to be restored when received. FIG. 2 functionally illustrates such a memory system 206 including a memory 208 and the transmitter/receiver 202.

Advantageously, the method provides that the error code incorporated in the original sequence $\underline{x}$ belongs to a non Boolean group.

The error code used is a linear code, as it will be apparent from the following detailed description of the method embodiments.

0.2 Codes on Different Groups

Additive groups are considered. The group of operation with the previous codes is Boolean, i.e. being x a field element it results that x+x=identity with respect to the sum. Now additive groups are considered (mod p) with $p \in N$.

Similar codes to the above-described codes are searched, i.e. codes for which, being H the code parity matrix and y the received word it results:

$$y \cdot H^T = 0$$

if y is a code word. Linear codes are thus searched. Moreover if y is affected by one or more errors, it results:

$$(y+\xi_i+\xi_j) \cdot H^T = \xi_i \cdot H^T + \xi_j \cdot H^T = s_i + s_j$$

where $s_i$ and $s_j$ are the i-th and j-th columns of the matrix $H^T$. The code being searched must therefore belong to an Abelian group to have this property.

Codes in a systematic form are searched and the method for forming the identity matrix is analyzed. Columns are considered as 10-base-written numbers. The matrix will then become a number vector and the product matrix by message received will become a scalar product. Operating in a group (mod p) the numbers composing the identity matrix must be such that the matrix composed of their binary representation has a determinant ≠0. The parity bit number n−k being fixed, p is chosen so that:

$$2^{n-k}+1 \leq p \leq 2^{n-k+1}-1$$

The identity matrix is composed of the numbers p-1, p-2, . . . , p-$2^{n-k}$. A code C [7,4] with p=8 is considered, the identity matrix will be composed of the numbers 7, 6 and 4. The binary-written matrix will then have the form: opposite to the usual identity matrix $$I_2 = \begin{pmatrix} 1 & 0 & 0 \\ 1 & 1 & 0 \\ 1 & 1 & 1 \end{pmatrix}$$

10

$$I_1 = \begin{pmatrix} 1 & 0 & 0 \\ 0 & 1 & 0 \\ 0 & 0 & 1 \end{pmatrix}$$

represented by the 10-based numbers: 1, 2 and 4

It must be noted that any matrix could be chosen, having a "determinant" ≠0, i.e. a number belonging to that matrix is not a linear combination of other numbers belonging to that matrix. This choice is particularly effective. It can be seen with an example.

Supposing that the product of a data vector by a certain matrix P (H=(P,I)) has given the result 1, which, binary-written as 100, will compose the code part to be added to the word. m is seen as a weight vector ci; thus being xi the numbers composing the matrix H (seen as a vector):

$$m \cdot H = \sum_{i=1}^{n} c_i x_i \quad ci = 0, 1$$

Where the sum is done (mod p). When the message is received, the multiplication $m \cdot H^T$ must occur, i.e. $(_{mk}, m_{n-k}) \cdot (P,I) = m_k \cdot P + m_{n-k} \cdot I$. In this case the first value is 1 and so that the message is correct it must be:

$1 + m^{n-k} \cdot I = 0 \pmod{p}$

The usual matrix i.e. [1,2,4] is chosen as identity matrix. It results:

[1,2,4] $(c_1, c_2, c_3) + 1 = 0$

Working in a field $Z_8$, instead of having 0 as second member, 8k can be obtained with k ∈ N. The solution is $(c_1, c_2, c_3) = (111)$.

The suggested matrix, i.e. [7,6,4], is now chosen as the matrix. It results:

[7,6,4] $(c_1, c_2, c_3) + 1 = 0$

The solution is $(c_1, C_2, C_3) = (100)$, i.e. the same value as the calculated code. This fact is not random, with the identity matrix suggested the calculated code is always equal to the code received if errors have not occurred.

The numbers composing the parity matrix P columns must be chosen according to similar criteria to those of the Boolean group.

With codes in these groups the error 1→0 is distinguished from 0→1, thus the channel is no more symmetrical. In fact:

if the syndrome returns a value x with x ∈ H the error occurred is 0→1;

if the syndrome returns a value x with x∉H, but p−x ∈ H, then the error occurred is 1→0;

An error +1 is allocated to the first case and an error −1 to the second case.

A code [6,1] with p=22 is considered.

H=(11|21 20 18 14 6)

In binary this matrix will be:

$$H = \begin{pmatrix} 1 & 1 & 0 & 0 & 0 & 0 \\ 1 & 0 & 0 & 1 & 1 & 1 \\ 0 & 1 & 1 & 0 & 1 & 1 \\ 1 & 0 & 0 & 0 & 1 & 0 \\ 0 & 1 & 1 & 1 & 0 & 0 \end{pmatrix}$$

The code words will then be:

0|00000

1|11010

The second code word is sent, but 111110 is received, i.e. an error +1 has occurred in the fourth position. Calculating: $(111110) \cdot H = 1 \cdot 11 + 1 \cdot 21 + 1 \cdot 20 + 1 \cdot 18 + 1 \cdot 14 = 84$ which, in the group considered, is 18. 18 is in the matrix H and thus the error occurred is 0→1, moreover 18 is in the fourth position of the matrix, which is the wrong message position.

Supposing now that 101010 is received, i.e. an error −1 has occurred in the second position. It must be calculated: $(101010) \cdot H = 1 \cdot 11 + 1 \cdot 20 + 1 \cdot 14 = 45$ which, in the group considered, is 1. 1 is not in the matrix H, but 22−1= is therein and therefore the error occurred is 1→0, moreover 21 is in the matrix second position which is the wrong position in the message.

It must be observed that the errors in the message received can be only of one type, or +1 or −1 in each position, if the corresponding bit is 0 or 1 in the message received. If an impossible error is detected, it means that the code could diagnose but not correct the errors.

A contradictory example is now described.

A code [3,1] in a group (mod 4) is considered, in which the matrix H=(1|32). The code words will be:

0|00   1|10

The message 000 is sent and 010 is received.

$(010) \cdot H = 3$ 3 is in the matrix and this would indicate an error +1 in the second position. 4−3=1 is also in the matrix and this would indicate an error −1 in the first position. In fact 010 can be obtained also from 110 with an error in the first position. Therefore a code cannot be found on $Z_4$. Sometimes, in order to correct the errors, it is necessary not only to calculate the syndrome but also to compare the bits received. A code [3,1] is considered on $Z_5$ with matrix H=(3|43). The code words will be:

0|00   1|11

The word 000 is sent, all errors which may occur and the decoding are considered.

001 ⇒ syndrome=3. Possible errors:
  1) +1 in the first position;
  2) +1 in the third position;
Given that a 0 is received in the first position, the case 1 is not possible.

010 ⇒ syndrome=4. Possible error: +1 in the second position.

100 ⇒ syndrome=3. Possible errors:
  1) +1 in the first position;
  2) +1 in the third position;
Given that a 0 is received in the third position, the case 2 is not possible. The word 111 is now sent, all errors which may occur and the decoding are considered.

011 ⇒ syndrome=2. Possible errors:
  1) −1 in the first position;
  2) −1 in the third position;
Given that a 1 is received in the third position, the case 2 is not possible.

101 ⇒ syndrome=1. Possible error: −1 in the second position.

110 ⇒ syndrome=2. Possible errors:
  1) −1 in the first position;
  2) −1 in the third position;
Given that a 1 is received in the first position, the case 1 is not possible.

Therefore the type of error occurred is distinguished by comparing the syndrome with the values actually received. The manufacture of a circuit describing this method involves the creation of non-binary adders as shown in FIG. 2, even if they operate with a frequency of 0 and 1 (writing each number with the binary representation). If for example operation is made on Z5, the adder must be able to say that (100)+(100)=(010), i.e. 1*1=2, but (110)+(010)=(000), i.e.

3*2=5. Moreover it must be possible to find the complement of a number which will be searched in the matrix.

The error correcting code methodology described herein may be utilized in a variety of different types of electronic systems, such as communications, digital video, memory and computer systems, as will be appreciated by those skilled in the art.

From the foregoing it will be appreciated that, although specific embodiments of the invention have been described herein for purposes of illustration, various modifications may be made without deviating from the spirit and scope of the invention.

The invention claimed is:

1. A method for making error corrections on digital information coded as symbol sequences, the method comprising:
   providing the transmission of sequences incorporating a portion of an error corrector code which allows the sequence which is more probably the original transmitted through the calculation of an error syndrome using a parity matrix to be restored when received;
   wherein the error corrector code incorporated in the original sequence belongs to a non Boolean group;
   wherein said parity matrix comprises an identity matrix having a non-zero determinant;
   wherein each number belonging to the parity matrix is not a linear combination of other numbers belonging to the same matrix;
   wherein operating in a group (mod p), a parity bit number n–k is fixed and p is chosen so that $(2^{n-k}+1) \leq p \leq 2^{n-k+1}-1$;
   wherein n equals a total number of bits in each sequence; and
   wherein k equals the number of information bits forming the digital information.

2. A method according to claim 1, wherein said error corrector code belongs to an Abelian group.

3. A method according to claim 1, wherein said error corrector code is a code in systematic form.

4. The method of claim 1 wherein the digital information comprises digital information stored in electronic memory systems or transmitted from and to these system.

5. A method according to claim 4, wherein said error corrector code is a linear code.

6. A method according to claim 4, wherein said error corrector code recognizes an error of the 0→1 type from an error of the 1→0 type.

* * * * *